(12) United States Patent
Goetz et al.

(10) Patent No.: US 6,989,555 B2
(45) Date of Patent: Jan. 24, 2006

(54) STRAIN-CONTROLLED III-NITRIDE LIGHT EMITTING DEVICE

(75) Inventors: Werner K. Goetz, Palo Alto, CA (US); Michael R. Krames, Mountain View, CA (US); Anneli Munkholm, Mountain View, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 10/830,202

(22) Filed: Apr. 21, 2004

(65) Prior Publication Data

US 2005/0236641 A1    Oct. 27, 2005

(51) Int. Cl.
*H01L 29/24*        (2006.01)

(52) U.S. Cl. .................. 257/101; 257/102; 257/103

(58) Field of Classification Search ......... 257/101–103
See application file for complete search history.

(56) References Cited

U.S. PATENT DOCUMENTS

| | | | |
|---|---|---|---|
| 5,793,054 A * | 8/1998 | Nido ............................ | 257/18 |
| 5,945,689 A * | 8/1999 | Koike et al. ................... | 257/88 |
| 6,265,289 B1 | 7/2001 | Zheleva et al. | |
| 6,285,696 B1 | 9/2001 | Bour et al. | |
| 6,455,337 B1 | 9/2002 | Sverdlov | |
| 6,599,362 B2 | 7/2003 | Ashby et al. | |
| 6,630,692 B2 | 10/2003 | Goetz et al. | |
| 6,635,904 B2 | 10/2003 | Goetz et al. | |
| 2001/0002048 A1 * | 5/2001 | Koike et al. ................... | 257/80 |
| 2003/0085409 A1 | 5/2003 | Shen et al. | |

FOREIGN PATENT DOCUMENTS

| | | |
|---|---|---|
| JP | 411243251 A | 9/1999 |
| JP | 2001160627 A * | 6/2001 |

OTHER PUBLICATIONS

Shuji Nakamura et al., "InGaN/GaN/AlGaN-based laser diodes with modulation-doped strained-layer superlattices grown on an epitaxially laterally overgrown GaN substrate," Appl. Phys. Lett. 72, (2), Jan. 12, 1998, pp. 211-213.

D.M. Follstaedt et al., "Minimizing threading dislocations by redirection during cantilever epitaxial growth of GaN," Applied Physics Letters, vol. 81, No. 15, Oct. 7, 2002, pp. 2758-2760.

* cited by examiner

*Primary Examiner*—Allan R. Wilson
(74) *Attorney, Agent, or Firm*—Patent Law Group LLP; Rachel V. Leiterman

(57) ABSTRACT

In a III-nitride light emitting device, a ternary or quaternary light emitting layer is configured to control the degree of phase separation. In some embodiments, the difference between the InN composition at any point in the light emitting layer and the average InN composition in the light emitting layer is less than 20%. In some embodiments, control of phase separation is accomplished by controlling the ratio of the lattice constant in a relaxed, free standing layer having the same composition as the light emitting layer to the lattice constant in a base region. For example, the ratio may be between about 1 and about 1.01.

15 Claims, 5 Drawing Sheets

STRAIN-CONTROLLED III-NITRIDE LIGHT EMITTING DEVICE

BACKGROUND

1. Field of Invention

The present invention is related to III-nitride light emitting devices.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III–V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, a light emitting or active region formed over the n-type layer or layers, and one or more p-type layers doped with, for example, Mg, formed over the active region. III-nitride devices formed on conductive substrates may have the p- and n-contacts formed on opposite sides of the device. Often, III-nitride devices are fabricated on insulating substrates, such as sapphire, with both contacts on the same side of the device. Such devices are mounted so light is extracted either through the contacts (known as an epitaxy-up device) or through a surface of the device opposite the contacts (known as a flip-chip device).

FIG. 1 illustrates a conventional III-nitride LED. The device of FIG. 1 includes a GaN or AlN buffer layer 31, an n-type GaN layer 32, an InGaN active layer 33, a p-type AlGaN layer 34, and a p-type GaN layer 35 which are stacked sequentially on the top face of a sapphire substrate 30. A portion of layers 33, 34, and 35 is removed by etching to expose a portion of n-type GaN layer 32, then an n-side electrode 6 is formed on the exposed portion of n-type GaN layer 32. A p-side electrode 5 is formed on the top face of remaining p-type GaN layer 35.

SUMMARY

In accordance with embodiments of the invention, in a III-nitride light emitting device, a ternary or quaternary light emitting layer is configured to control the degree of phase separation. In some embodiments, the difference between the InN composition at any point in the light emitting layer and the average InN composition in the light emitting layer is less than 20%. In some embodiments, control of phase separation is accomplished by controlling the ratio of the lattice constant in a relaxed, free standing layer having the same composition as the light emitting layer to the lattice constant in a base region. For example, the ratio may be between about 1 and about 1.01.

DETAILED DESCRIPTION

Figure 1:
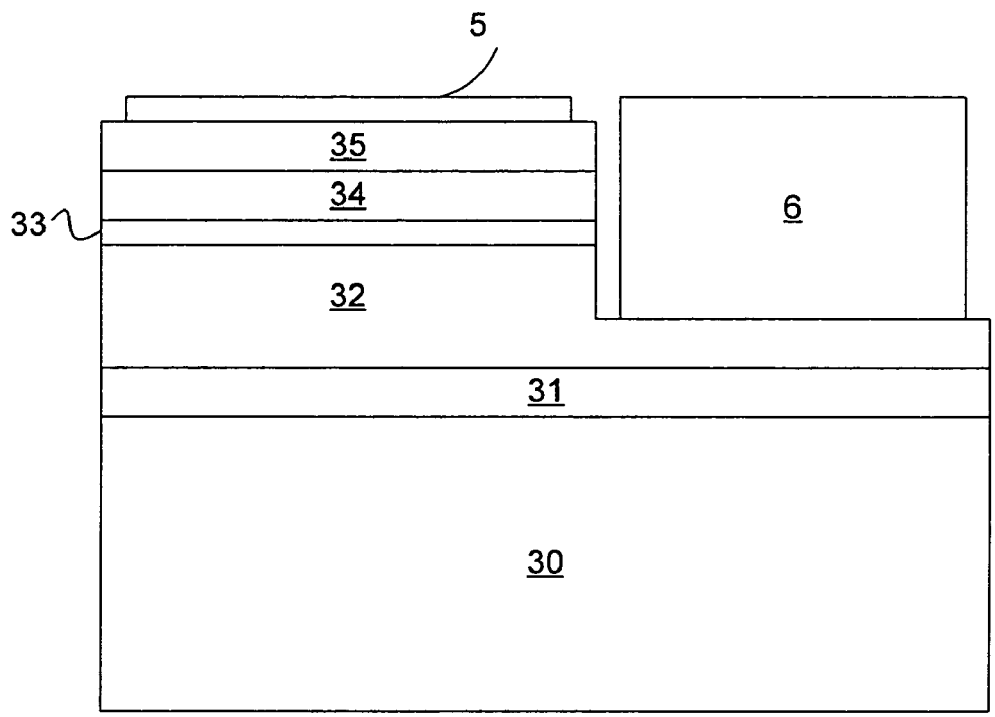
FIG. 1 illustrates a prior art III-nitride LED.
Figure 2:
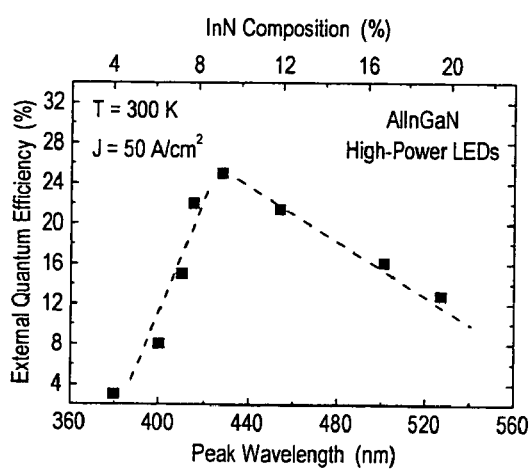
FIG. 2 is a plot of external quantum efficiency as a function of peak wavelength for a III-nitride LED.

A III-nitride device grown on sapphire or SiC such as the device illustrated in FIG. 1, typically have threading dislocation densities on the order of $5-50 \times 10^8$ cm$^{-2}$. Such LEDs may exhibit the following undesirable behaviors. First, the internal quantum efficiency (IQE), defined as the number of photons generated within the active region of the device divided by the number of electrons supplied to the device, is generally highest for LEDs with light emitting layers that contain an InN composition of about 5 to 10%, resulting in a peak emission wavelength of about 400 nm. As the InN composition and peak emission wavelength increase, the IQE decreases. For some devices, the IQE reaches almost zero for an InN composition of about 25%, corresponding to a peak emission wavelength longer than about 550 μm. For light emitting layers with less than about 5% InN composition (peak emission wavelength shorter than about 400 nm), the IQE also decreases. This behavior is illustrated in FIG. 2, which is a plot of IQE as a function of wavelength and InN composition. The data in FIG. 2 correspond to light emitting layers of a given thickness. As the thickness of the light emitting layer changes, the maximum external quantum efficiency may shift from the point illustrated in FIG. 2.

Figure 3:
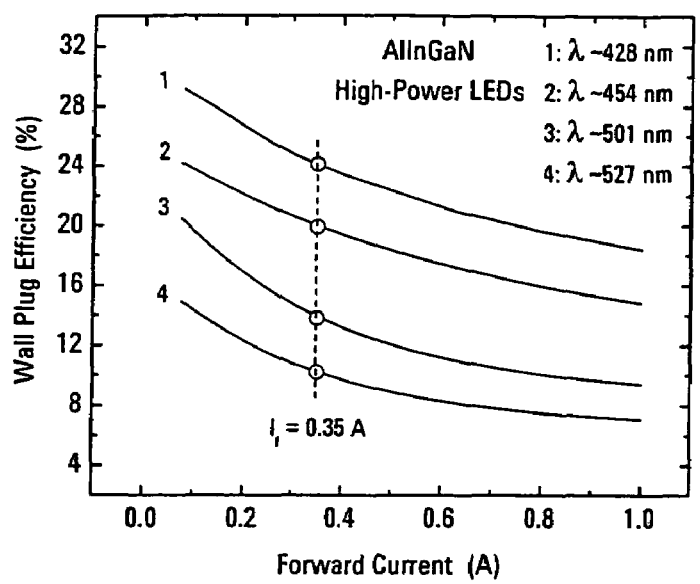
FIG. 3 is a plot of wall plug efficiency as a function of forward current for four devices emitting light at different wavelengths.

Second, the efficiency of a III-nitride based LED of a given color also depends on drive current. The efficiency generally peaks at a relatively low current density and decreases rapidly as the current density increases. In general, the decrease in efficiency is strongest the longer the emission wavelength of the LED. This behavior is illustrated in FIG. 3, which is a plot of wall plug efficiency, defined as optical power out of the device divided by electrical power supplied to the device, as a function of forward current for four devices with peak emission wavelengths ranging from 428 nm to 527 nm.

One explanation for the decrease in efficiency as InN composition in the light emitting layers and current density increase may be phase separation of InGaN light emitting layers due to strain and lattice defects in the crystal.

III-nitride light emitting devices are generally grown on substrates such as sapphire and SiC. Such substrates have a significant lattice- and coefficient-of-thermal-expansion-mismatch with III-nitride crystal layers. As a consequence, crystal imperfections, especially threading dislocations, are present at high density in the crystal layers grown on such substrates. In addition, III-nitride based devices are generally grown along the [0001] or "c" crystallographic axis resulting in (0001) or c-plane material. The lattice constants of III-nitride ternary alloys such as InGaN vary significantly with composition. In the case of (0001) InGaN, the lattice mismatch between GaN and InN is 11%. As a consequence, thin InGaN light emitting layers with low InN composition grown on a GaN base layer are compressively strained. Though the above discussion refers to c-plane III-nitride devices, the concepts and embodiments described herein may be equally applicable to III-nitride crystals of other orientations, such as a-plane and m-plane. Accordingly, the invention is not limited to (0001) devices.

InN and GaN are not fully miscible in an InGaN alloy. At a given set of growth conditions, critical InN compositions exist as upper and lower limits defining a composition region that is energetically unfavorable. The above-described strain and lattice defects present in III-nitride layers tend to force InGaN layers grown too thick or with a composition in this "forbidden" range to phase separate into InN and GaN. Phase separation results in InGaN pockets with an InN composition above the upper and below the lower composition limit. Clusters of InN-rich InGaN material form that are separated by regions of material containing less InN than the average InN composition of the InGaN layer. Such InN-rich regions have been observed in the light emitting layers of devices having InGaN light emitting layers containing more than about 8% InN and grown on GaN base layers. For example, in a device with an InGaN light emitting layer with an average InN composition of 11% grown on GaN, the inventors observed that one standard deviation in InN composition in the light emitting layer is 2% InN. The light emitting layer InN composition is expected to range from three standard deviations below the average to three standard deviations above the average, i.e. between 5% and 17% InN, a variation of 54% from the average. The highest InN composition actually observed was 22%, a variation of 100% from the average. For a device with an InGaN light emitting layer with an average InN composition of 20% grown on GaN, one standard deviation in InN composition in the light emitting layer is also observed to be 2% InN, resulting in an expected range between 14% and 26% InN, a variation of 30% from the average. The highest InN composition actually observed was 38%, a variation of 90% from the average.

The ability to fabricate III-nitride light emitters with high quantum efficiency is often credited to the fact that the above-described InN-rich regions in the InGaN light emitting layers have a smaller band gap than the rest of the InGaN layers, and thus confine electrons and holes in the InN-rich regions, preventing non-radiative recombination at the crystal defects caused by growth on mismatched substrates. In other words, due to the presence of non-radiative recombination sites in conventional III-nitride light emitting devices, some degree of phase-separation in the InGaN light emitting layers may be necessary to achieve high radiative recombination efficiency. At high InN compositions however, the phase-separation is so significant that any benefit of phase-separation may be outweighed by problems introduced by phase-separation, as demonstrated by the undesirably low external quantum efficiency at high InN composition illustrated in FIG. 2.

Figure 4:
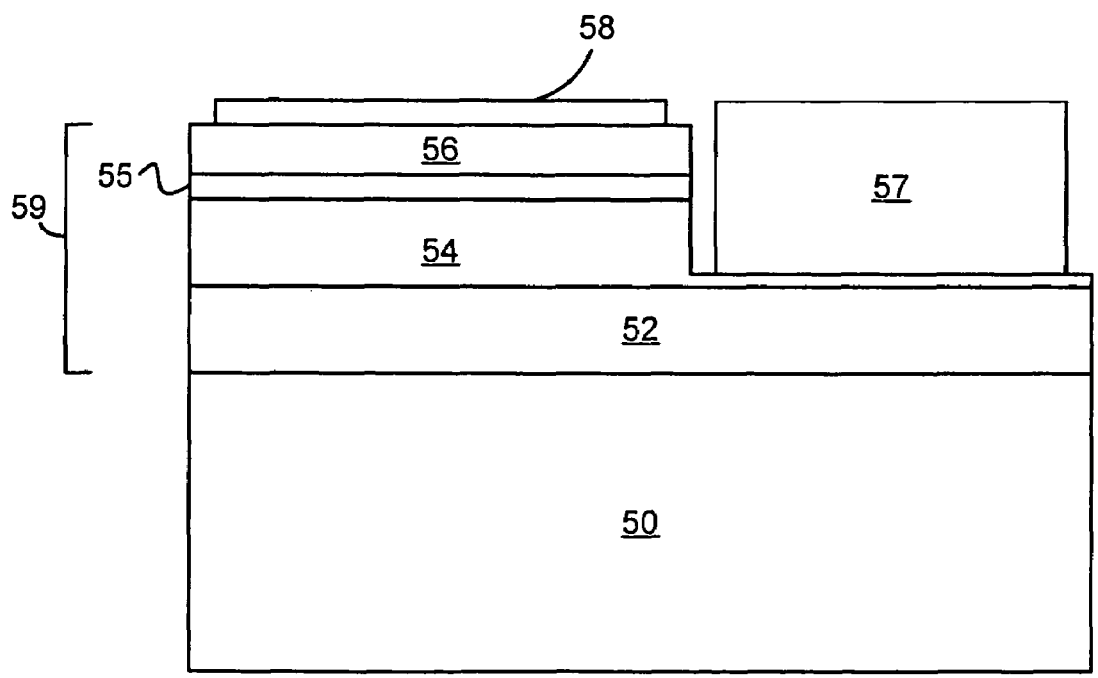
FIG. 4 is a cross sectional view of a III-nitride device according to embodiments of the invention.

FIG. 4 illustrates a III-nitride light emitting device according to embodiments of the invention. An n-type or undoped base region 52 is grown over substrate 50. A nucleation region (not shown) is generally grown on substrate 50 before base region 52 is grown. The nucleation region includes one or more layers of polycrystalline or amorphous material. The beginning of base region 52 is the first single crystal material grown over the nucleation region. An n-type region 54 is disposed between base layer 52 and active region 55. A p-type region 56 is formed over active region 55. Each of base region 52, n-type region 54, active region 55, and p-type region 56 may contain one or more layers of different thickness, composition, and dopant concentration. For example, active region 55 may include one or more quantum well layers or light emitting layers surrounded by barrier layers of different composition.

In the embodiment illustrated in FIG. 4, a portion of p-type region 56 and active region 55 is etched away to reveal a portion of n-type region 54. P-contact 58 is formed on the remaining part of p-type region 56 and n-contact 57 is formed on the exposed portion of n-type region 54. Light may be extracted through the top of the device by forming transparent contacts or contacts that cover a small portion of the top of the epitaxial structure. Light may be extracted through the bottom of the substrate of the device by making the contacts reflective, as is known in the art. In such devices, at least one of base region 52 and n-type region must be thick enough and sufficiently doped to provide current spreading on the n-side of the active region. In other embodiments, substrate 50 is conductive and one of the contacts is formed on the bottom of substrate 50. In still other embodiments, the epitaxial layers 59 are bonded to a host substrate through a conductive interface to p-type region 56, then growth substrate 50 is removed and n-contact 57 is formed on the surface exposed by growth substrate removal. Growth substrate removal is described in more detail in application Ser. No. 10/804,810, filed Mar. 19, 2004, titled "Photonic Crystal Light Emitting Device," assigned to the assignee of the present invention, and incorporated herein by reference. In embodiments where substrate 50 is conductive or removed, base region 52 may be thinner than in the device of FIG. 4. Though FIG. 4 shows n-type region 54 grown over substrate 50 before p-type region 56, in some embodiments the growth order may be reversed such that p-type region 56 is grown before n-type region 54. In such embodiments, base region 52 may be p-type or undoped material.

In accordance with embodiments of the device, the characteristics of base region 52 and the light emitting layers of active region 55 are chosen to control phase-separation in the light emitting layers. In other words, the characteristics of base region 52 and the light emitting layers of active region 55 are chosen such that the InN composition at any point in a given light emitting layer is close to the average InN composition across the entire light emitting layer; in some embodiments, the InN composition at any point varies less than 20% from the average InN composition. The variation is preferably less than 10% from the average InN composition, and more preferably less than 5% from the average InN composition. Though the examples below describe InGaN light emitting layers, similar phase-separation behavior is expected in quaternary AlInGaN light emitting layers. Accordingly, the teachings herein are applicable to quaternary light emitting layers.

In some embodiments, the light emitting layers of the active region are prevented from phase-separating by controlling the mismatch in lattice constant between the light emitting layers and base region 52. In some embodiments, the ratio of the lattice constant in a relaxed, free standing layer having the same composition as the light emitting layer to the lattice constant in a base region is between about 1 and about 1.01. Though the use of InGaN outside the active region is generally disfavored due to the difficulty of growing high quality InGaN and the sensitivity of InGaN to high process temperatures, InGaN may be used in base region 52 to limit the lattice constant mismatch with the light emitting layers. In InGaN, lattice constant varies almost linearly with composition. Thus, for a binary GaN or ternary InGaN base region 52, the lattice constant is tied to the InN composition in the base region and, for a given InGaN light emitting layer of active region 52, the base region InN composition may be selected to control the lattice constant mismatch. In some embodiments, base region 52 includes at least one quaternary AlInGaN layer. The use of quaternary layers permits the lattice constant to be engineered independently of the band gap.

Figure 5:
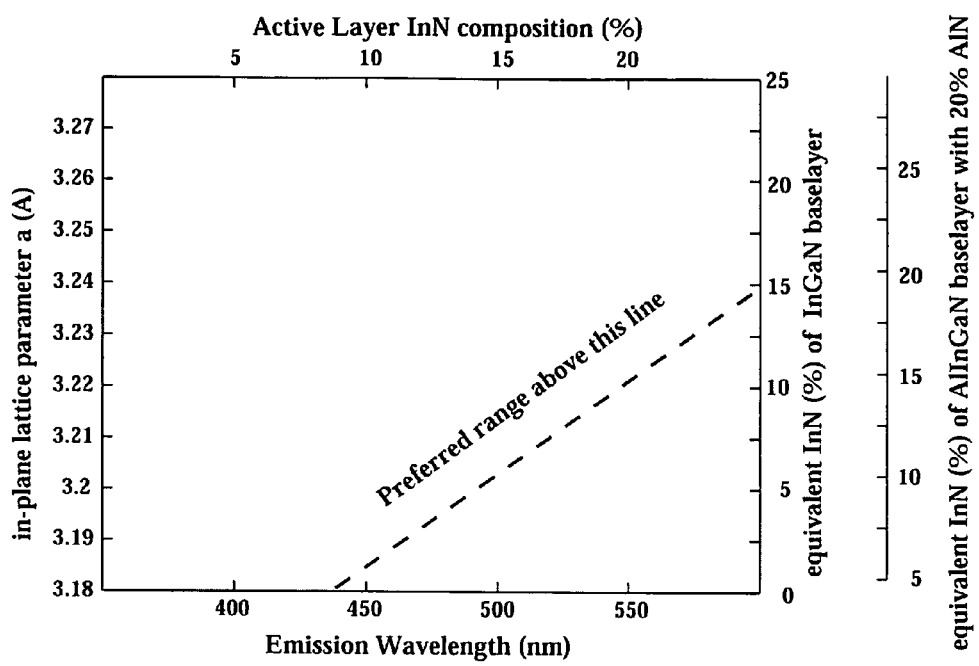
FIG. 5 illustrates possible ranges for InN composition in the base region and light emitting layers of the device of FIG. 4.

FIG. 5 illustrates, for a given InGaN light emitting layer composition, acceptable lattice parameters for the base region, acceptable InN compositions for a GaN or InGaN base region, and acceptable InN compositions for a quaternary AlInGaN base region including 20% AlN. The preferred base region lattice constants and InN compositions lie on and above the dashed diagonal line in FIG. 5. In a first example, a device with a GaN base region 52 may have InGaN light emitting layers with an InN composition less than or equal to about 8%. In a second example, a device emitting light at about 500 nm has an InN composition in the InGaN light emitting layers of about 15%. The lattice constant in the base region should be about 3.2 Å or greater. The InN composition of an InGaN base region device should be at least 7%. The InN composition of an AlInGaN base region with 20% AlN should be at least 10%. In a third example, a device emitting light at about 550 nm has an InN composition in the InGaN light emitting layers of about 20%. The lattice constant in the base region should be about 3.22 Å or greater. The InN composition of an InGaN base region should be at least 12%. The InN composition of an AlInGaN base region with 20% AlN should be at least 14%. Though FIG. 5 shows acceptable InN compositions in a quaternary layer including 20% AlN as an example, it is to be understood that any quaternary layer composition having a lattice parameter above the dashed diagonal line in FIG. 5 may be used.

Base region 52 is generally a thick region, for example, at least about one micron thick. Base region 52 sets the lattice constant for the layers grown above base region 52 including the light emitting layer or layers of the active region. The layers grown between base region 52 and the light emitting layers, and the light emitting layers themselves, are grown thin enough that they are strained. The strained state maintains the lattice constant of base region 52 in, for example, n-type region 54, which spaces base region 52 from active region 55, and the light emitting layers of active region 55. For example, when grown on a GaN base region, in order to maintain the strained state, an InGaN light emitting layer with 8% InN may have a thickness less than about 330 nm; an InGaN light emitting layer with 10% InN may have a thickness less than about 75 nm; and an InGaN light emitting layer with 14% InN may have a thickness less than about 30 nm.

Controlling the mismatch in lattice constant between the light emitting layers and base region 52 to prevent phase separation may permit the use of thicker light emitting layers. In a conventional III-nitride device, the quantum wells in a multiple quantum well active region are typically limited to a thickness of about 5 nm for about 10% InN composition and to a thickness of about 3 nm for about 20% InN composition. In a device where the characteristics of base region 52 and the light emitting layers of active region 55 are chosen to substantially reduce phase-separation in the light emitting layers, thicker quantum wells may be used, for example about 5 nm for an InN composition of about 20%. Further, a single, thick light emitting layer may be used, for example with a thickness between about 5 nm and about 300 nm.

Base regions with appropriate lattice constants may be fabricated using known III-nitride growth techniques. When a SiC growth substrate is used, base region 52 may be grown directly on the substrate. When a sapphire growth substrate is used, base region 52 may be grown on a nucleation region.

In some embodiments, a base region 52 of appropriate lattice constant is grown over an InN-containing nucleation layer or layers. The nucleation layers closest to the substrate may have more indium than layers further from the substrate. The nucleation layers may be grown at a low temperature, for example between about 400° C. and about 650° C. A cap layer formed at higher temperature may be formed over the InN-containing nucleation layers. The growth of InN-containing nucleation layers is known in the art.

In some embodiments, an InGaN base region is grown by first growing a conventional low temperature (for example, 400° C. to 650° C.) GaN nucleation layer (for example, 150 Å to 350 Å thick) on a sapphire (0001) substrate. A base region of a thick (0.5–5 micron) InGaN film is then grown on top of the GaN nucleation layer. The resulting lattice parameter of this base region is determined by the InN composition in the InGaN film, since it is not strained to the underlying low temperature GaN nucleation layer. Typical precursors for the high temperature InGaN film are tri-methyl indium (TMI) and tri-ethyl gallium (TEG) or tri-methyl gallium (TMG) in an $N_2$ ambient. The InN composition in the base region can be controlled by the growth temperature, e.g. ~975° C. for a ~3% InGaN film. Lowering the InGaN growth temperature will increase the InN incorporation and the in-plane lattice parameter. The InGaN film base region can be either undoped or doped.

In some embodiments, a base region of appropriate lattice constant is grown over a structure that "resets" the lattice constant of the device. For example, a base region 52 of appropriate composition may be grown as an InN-containing coalescence layer grown over a GaN defect reduction layer or a Si-dosed GaN defect reduction layer. The growth of such coalescence layers and defect reduction layers are described in U.S. Pat. No. 6,630,692 to Goetz et al, which is assigned to the assignee of the present application and incorporated herein by reference.

A device as described above, where the InN composition at any point in the light emitting layer varies less than 20% from the average InN composition, may require reduced dislocation densities, since the light emitting layers lack InN-rich regions which prevent non-radiative carrier recombination via defect states. In some embodiments, devices according to FIG. 4 may require dislocation densities less than about $5 \times 10^8$ cm$^{-2}$. Devices with dislocation densities less than about $5 \times 10^8$ cm$^{-2}$ may be grown by, for example, techniques such as epitaxial lateral overgrowth, pendeoepitaxy, or cantilever epitaxy. Epitaxial lateral overgrowth, pendeoepitaxy, and cantilever epitaxy are well known in the art and described in the following patents and publications, each of which is incorporated by reference: U.S. Pat. No. 6,599,362; Follstaedt et al., "Minimizing threading dislocations by redirection during cantilever epitaxial growth of GaN," Appl. Phys. Lett., 81, 2758 (2002); Nakamura et al., "InGaN/GaN/AlGaN-based laser diodes with modulation-doped strained-layer superlattices grown on an epitaxially laterally overgrown GaN substrate," Appl. Phys. Lett. 72, 211 (1998); Kato et al., J. Cryst. Growth, 144, 133 (1994); and U.S. Pat. No. 6,265,289.

Figure 6:
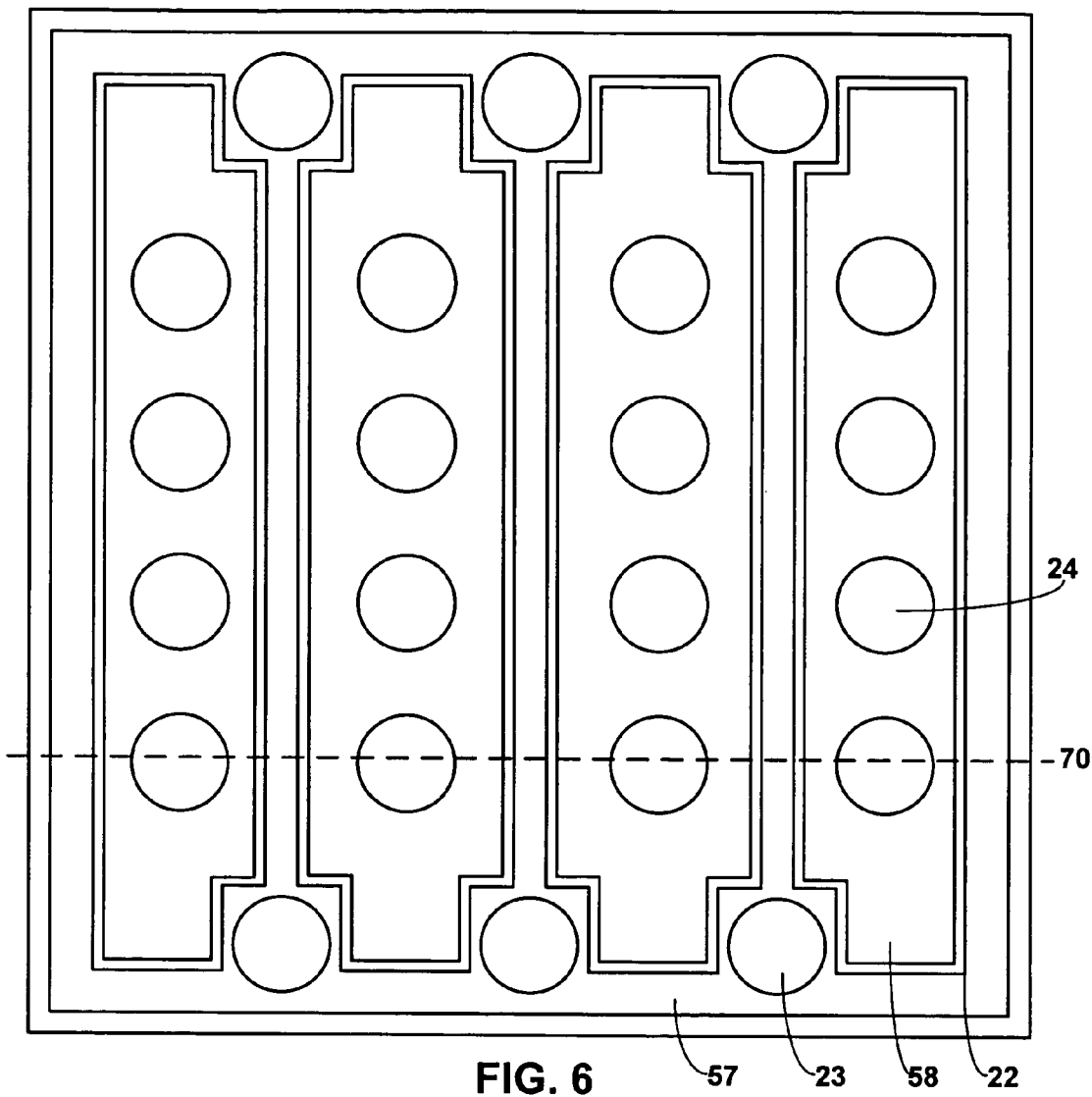
FIGS. 6 and 7 illustrate a plan view and a cross sectional view of an arrangement of contacts on the device illustrated in FIG. 4.
Figure 7:
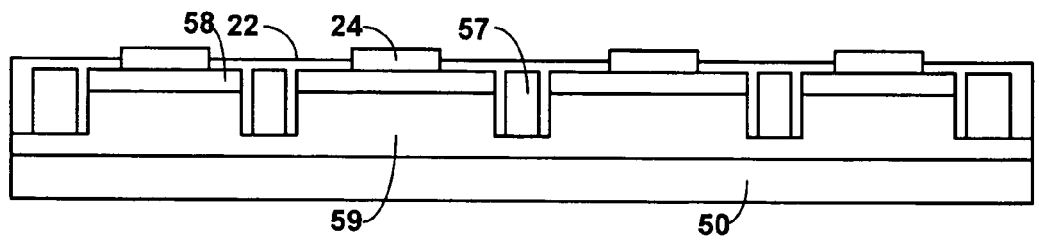

FIG. 6 is a plan view of a large junction device (i.e. an area greater than or equal to one square millimeter). FIG. 7 is a cross section of the device shown in FIG. 6, taken along axis 70. FIGS. 6 and 7 illustrate an arrangement of contacts that may be used with any of the epitaxial structures 59 illustrated and described in FIG. 4 and accompanying text. The active region of epitaxial structure 59 is separated into four regions separated by three trenches in which n-contacts 57 are formed. Each region is connected to a submount by four p-submount connections 24 formed on p-contact 58. N-contact 57 surrounds the four active regions. N-contact 57 is connected to a submount by six n-submount connections 23. The n- and p-contacts may be electrically isolated by an insulating layer 22. The device illustrated in FIGS. 6 and 7 is typically mounted in flip chip configuration, such that most of the light exiting the device exits through the growth substrate 50.

Figure 8:
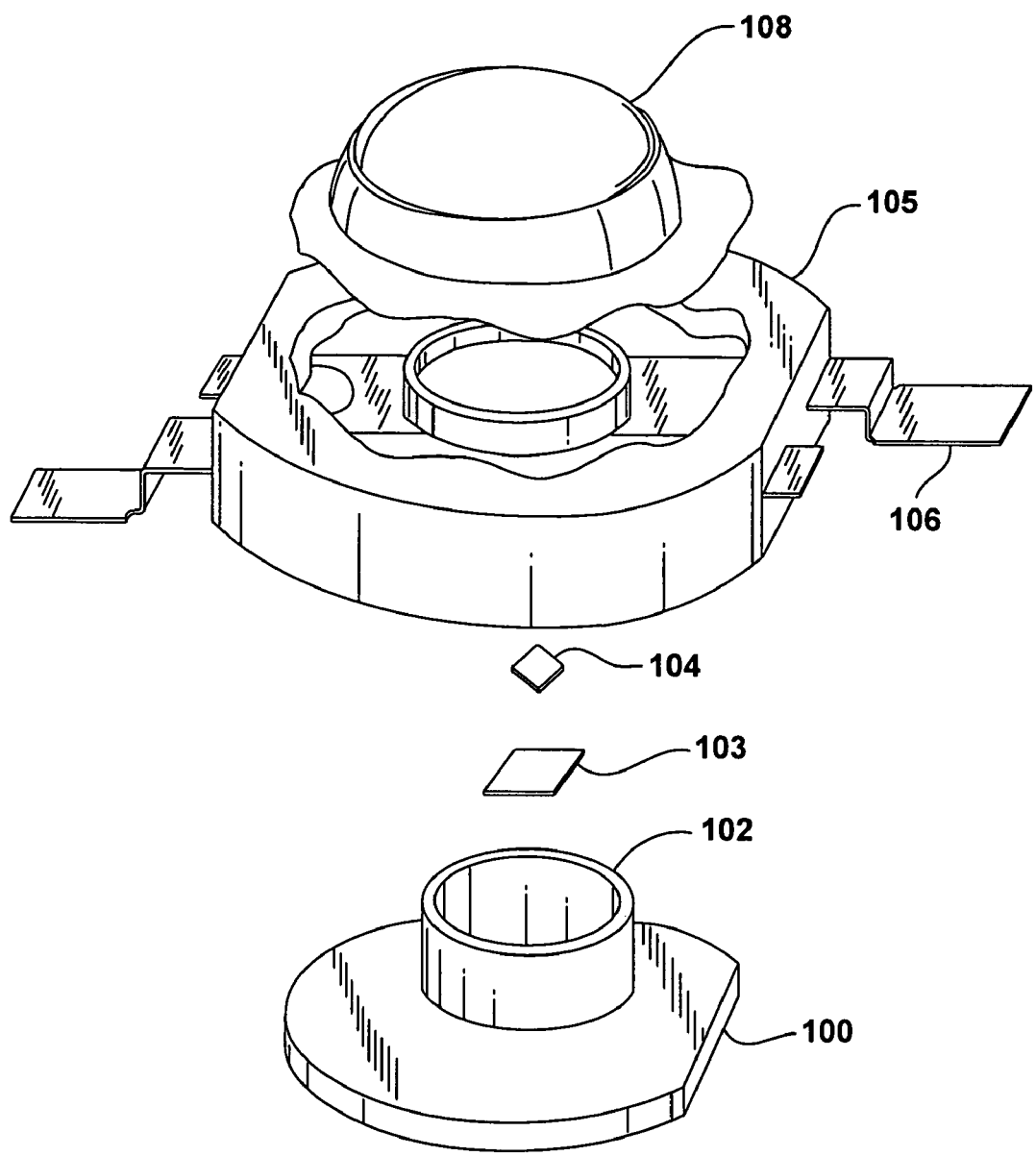
FIG. 8 illustrates a packaged light emitting device.

FIG. 8 is an exploded view of a packaged light emitting device. A heat-sinking slug 100 is placed into an insert-molded lead frame 106. The insert-molded lead frame 106 is, for example, a filled plastic material molded around a metal frame that provides an electrical path. Slug 100 may include an optional reflector cup 102. The light emitting device die 104, which may be any of the devices described above, is mounted directly or indirectly via a thermally conducting submount 103 to slug 100. A cover 108, which may be an optical lens, may be added.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A semiconductor light emitting device comprising:
    a nucleation region; and
    an epitaxial structure comprising:
        a base region formed on the nucleation region; and
        a III-nitride light emitting layer overlying the base region and disposed between an n-type region and a p-type region and overlying the base region; wherein:
        the light emitting layer is configured to emit light having a peak emission wavelength greater than 420 nm; and
        the light emitting layer and base region are configured such that:
            the light emitting layer has an average InN composition b; and
            an InN composition at any point in the light emitting layer is between (b−0.2b) and (b+0.2b).

2. The device of claim 1 wherein the InN composition at any point in the light emitting layer is between (b−0.1b) and (b+0.1b).

3. The device of claim 1 wherein InN composition at any point in the light emitting layer is between (b−0.05b) and (b+0.05b).

4. The device of claim 1 wherein the light emitting layer is InGaN.

5. The device of claim 1 wherein the base region is $Al_xIn_yGa_zN$, where $0 \leq x \leq 1$, $0 \leq y \leq 1$, and $0 \leq z \leq 1$.

6. The device of claim 1 wherein the base region is $In_xGa_yN$, where $0 \leq x \leq 1$ and $0 \leq y \leq 1$.

7. The device of claim 1 wherein a dislocation density in the n-type region, light emitting layer, and p-type region is less than about $5 \times 10^8$ cm$^{-2}$.

8. The device of claim 1 wherein the light emitting layer and any layers between the light emitting layer and the base region are strained.

9. A semiconductor light emitting device comprising:
    a nucleation region; and
    an epitaxial structure comprising:
        a base region formed on the nucleation region; and
        a III-nitride light emitting layer overlying the base region and disposed between an n-type region and a p-type region; wherein the light emitting layer and base region are configured such that:
            the light emitting layer has an average InN composition b;
            the average InN composition b is greater than 8%; and
            an InN composition at any point in the light emitting layer is between (b−0.2b) and (b+0.2b).

10. The device of claim 9 wherein the InN composition at any point in the light emitting layer is between (b−0.1b) and (b+0.1b).

11. The device of claim 9 wherein InN composition at any point in the light emitting layer is between (b−0.05b) and (b+0.05b).

12. The device of claim 9 wherein the light emitting layer is AlInGaN.

13. The device of claim 9 wherein:
    the base region has a lattice constant $a_1$;
    a relaxed, free standing layer having a same composition as the light emitting layer has a lattice constant $a_2$; and
    a ratio of $a_2$ to $a_1$ is between about 1 and about 1.01.

14. The device of claim 9 wherein the base region is $Al_xIn_yGa_zN$, where $0 \leq x \leq 1$, $0 \leq y \leq 1$, and $0 \leq z \leq 1$.

15. The device of claim 9 wherein the light emitting layer is configured to emit light having a peak emission wavelength greater than 420 nm.

* * * * *